United States Patent
Rowley

(10) Patent No.: US 10,423,218 B1
(45) Date of Patent: Sep. 24, 2019

(54) POWER MANAGEMENT INTEGRATED CIRCUIT WITH IN SITU NON-VOLATILE PROGRAMMABILITY

(71) Applicant: Micron Technology, Inc., Boise, ID (US)

(72) Inventor: Matthew David Rowley, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 15/919,036

(22) Filed: Mar. 12, 2018

(51) Int. Cl.
| | |
|---|---|
| *G06F 1/3296* | (2019.01) |
| *G06F 12/02* | (2006.01) |
| *G11C 16/26* | (2006.01) |
| *G11C 16/30* | (2006.01) |
| *H01L 27/11526* | (2017.01) |
| *G11C 7/20* | (2006.01) |
| *G11C 7/22* | (2006.01) |
| *H01L 27/11521* | (2017.01) |
| *G11C 5/14* | (2006.01) |

(52) U.S. Cl.
CPC ........ *G06F 1/3296* (2013.01); *G06F 12/0238* (2013.01); *G11C 5/147* (2013.01); *G11C 7/20* (2013.01); *G11C 7/22* (2013.01); *G11C 16/26* (2013.01); *G11C 16/30* (2013.01); *H01L 27/11521* (2013.01); *H01L 27/11526* (2013.01)

(58) Field of Classification Search
None
See application file for complete search history.

(56) References Cited

U.S. PATENT DOCUMENTS

2011/0022826 A1 * 1/2011 More ................... G06F 1/26
713/1

* cited by examiner

*Primary Examiner* — James G Norman
(74) *Attorney, Agent, or Firm* — Greenberg Traurig, LLP

(57) ABSTRACT

Disclosed is a power management integrated circuit including dual one-time programmable memory banks and methods for controlling the same. In one embodiment, the power management integrated circuit (PMIC) includes a first one-time programmable (OTP) memory bank; a second OTP memory bank; and access control logic, communicatively coupled to the first OTP bank and the second OTP bank, the access control logic configured to: utilize the first OTP memory bank for operation of the PMIC upon detecting that the second OTP memory bank is empty, write data to the second OTP memory bank in response to a write request from a host application if the second OTP memory bank is not empty, and utilize the second OTP memory bank for operation of the PMIC upon detecting that the second OTP memory bank is not empty.

18 Claims, 3 Drawing Sheets

POWER MANAGEMENT INTEGRATED CIRCUIT WITH IN SITU NON-VOLATILE PROGRAMMABILITY

FIELD OF THE TECHNOLOGY

At least some embodiments disclosed herein relate to power management integrated circuit (PMIC) in general and, more particularly but not limited to, a PMIC with in situ non-volatile programmability.

BACKGROUND

A memory system can be a storage system, such as a solid-state drive (SSD), and can include one or more memory components that store data. For example, a memory system can include memory devices such as non-volatile memory devices and volatile memory devices. In general, a host system can utilize a memory system to store data at the memory devices of the memory system and to retrieve data stored at the memory system.

A memory system can include a PMIC to manage the power requirements of the memory system in which the PMIC is configured. The PMIC typically includes electronic power conversion circuitry and relevant power control functions. A PMIC additionally allows for programmable control of the functionality of the PMIC. For example, a PMIC may be reconfigured to change the power sequence, output voltages, and various other functions of the PMIC.

Certain dedicated hardware is included within a PMIC package to support programmatic control of the device. For example, a register file is used for storing values controlling the operation of the device. More recent PMICs incorporate non-volatile memory (e.g., electrically erasable programmable read-only memory, or, EEPROM) for storage of data. The use of non-volatile memory allows for storage of data values that persists despite (sometimes frequent) power cycles.

These conventional storage mechanisms in PMIC suffer from particular deficiencies. A register file is a volatile storage device, and any data stored therein is lost during power cycling of the PMIC. Thus, despite being convenient for storage during operations, the register file fails to maintain data in the event of a power cycle, making it unsuitable for longer-term value storage. This deficiency is particularly pronounced during development and testing of PMIC devices, where operational parameters regarding the operation of the PMIC during power cycles is desired to be tested.

The use of non-volatile memory, like EEPROM, enables long-term, reprogrammable storage of data. However, the circuitry required to support these memories (in addition to existing read-only memory) increases the size and power consumption of PMIC devices. For example, a PMIC with a read-only memory bank and an EEPROM bank requires twice the circuitry for accessing the read-only memory bank as well as supporting erasing and writing to the EEPROM.

BRIEF DESCRIPTION OF THE DRAWINGS

The embodiments are illustrated by way of example and not limitation in the figures of the accompanying drawings in which like references indicate similar elements.

DETAILED DESCRIPTION

Aspects of the present disclosure are directed to a power management integrated circuit (PMIC) in a memory system. An example of a memory system is a storage system, such as a solid-state drive (SSD). In some embodiments, the memory system is a hybrid memory/storage system. In general, a host system can utilize a memory system that includes one or more memory devices. The memory devices can include media. The media can be non-volatile memory devices, such as, for example, negative- and (NAND). The host system can provide write requests to store data at the memory devices of the memory system and can provide read requests to retrieve data stored at the memory system. A memory system can include a controller that manages the memory devices to perform operations such as reading data, writing data, or erasing data and other such operations. A storage system (also hereinafter referred to as storage device) is used as one example of the memory system hereinafter throughout this document.

Figure 1:
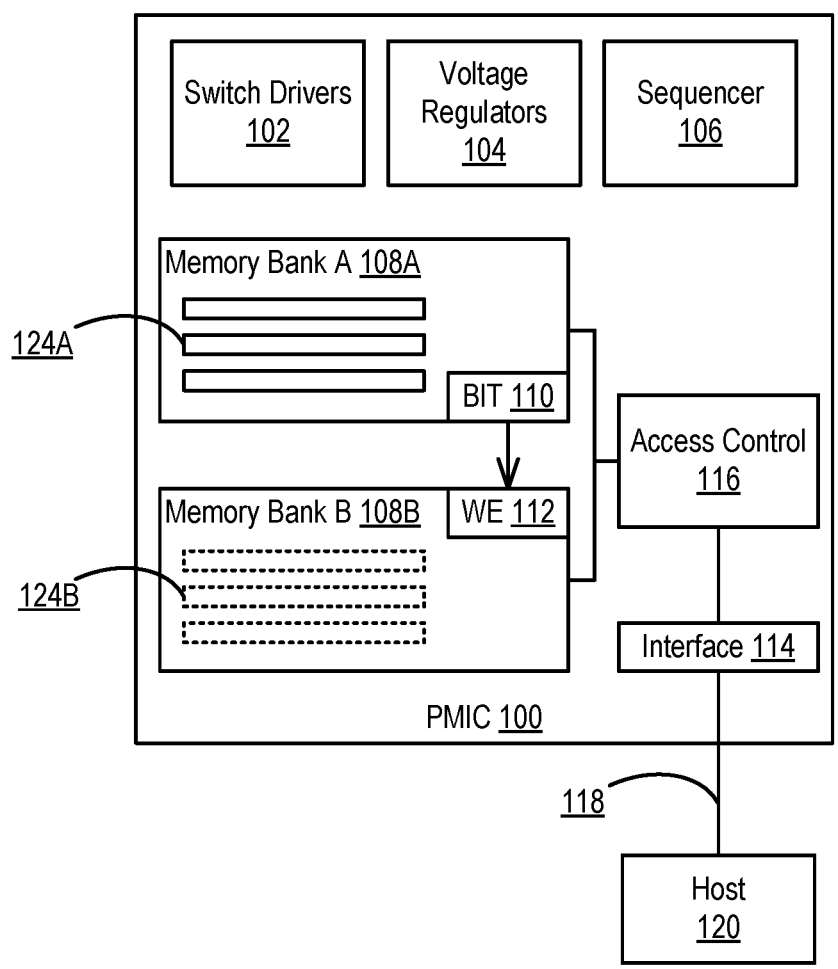
FIG. 1 is a block diagram of a power management integrated circuit according to some embodiments of the disclosure.

FIG. 1 is a block diagram of a power management integrated circuit according to some embodiments of the disclosure.

The PMIC (100) illustrated in FIG. 1 includes switch drivers (102), voltage regulators (104), sequencer (106), memory banks (108A, 108B), access control circuitry (116) and an interface (114). In one embodiment, the PMIC (100) is connected to a host application (120) via a bus (118), such as an I2C bus. In the illustrated embodiment, the host application (120) comprises an external computing device that provides read and, more importantly, write commands to the PMIC (100). In the illustrated embodiment, interface (114) is configured to receive and transmit commands over the bus (118) and forward write requests to the access control logic (116).

The PMIC (100) has one or more voltage regulators (104) that convert the external power supply to the PMIC (100) to operating voltages used by various components of the device (or devices) powered by the PMIC (100) (e.g., solid-state storage devices, DRAM, etc.). The PMIC (100) includes a plurality of switch drivers (102) that provide the control signals for the load switches (not illustrated) that selectively enable and disable power to and from the supported devices. The PMIC (100) includes a sequencer (106) that schedules the power-related events according to desirable sequences for the operations of the supported devices, including the sequences of the operations of the voltage regulators (102) and the switch drivers (104).

PMIC (100) includes two memory banks (108A, 108B). In one embodiment, each memory bank (108A, 108B) comprises a one-time programmable (OTP) memory bank. In general, OTP memory allows for write-once, read-many functionality. In the illustrated embodiment, each memory bank (108A, 108B) comprises the same type of memory, although, in some embodiments, the memory banks (108A, 108B) may comprise differing OTP memory technologies. In some embodiments, memory banks (108A, 108B) are identically sized while in other embodiments the size of each memory bank (108A, 108B) may be adjusted based on the needs of the PMIC (100). For example, memory bank (108B) may be sized larger than memory bank (108A) to compensate for the single-write aspects of the memory bank (e.g., multiple versions of parameters may be stored during development). On the other hand, memory bank (108A) may be sized larger than memory bank (108B) to support vendor-specific parameters.

As described above, memory banks (108A, 108B) store parameters (124A, 124B) controlling the operation of the PMIC (100) including circuitry (102-106). Various circuits of the PMIC (100) access the memory banks (108A, 108B) and utilize the stored parameters to control their operation. Parameters (124B) are dashed in FIG. 1 to illustrate an empty bank (108B).

Both memory banks (108A, 108B) may include a write enable pin, pad, or connector (referred to generally as a "write enable"). This write enable controls whether writing is possible to the memory bank, regardless of whether the memory bank has already been written to, thus converting the memory bank into a write-never memory device. One write enable (112) is illustrated in the memory bank (108B) however in some embodiments memory bank (108A) also may include a write enable.

As illustrated, one memory bank (108A) includes a dedicated bit (110). This dedicated bit (110) drives the write enable (112) of the second memory bank (108B). In some embodiments, other signals may also drive the write enable (112), and these signals, combined with bit (110) may be multiplexed to control writing to the bank (108B). In the illustrated embodiment, bit (110) comprises a fixed location in the bank (108A). For example, a specific bit in a specific memory location may be used as the bit (110). In one embodiment, the bit (110) is hardwired to the write enable (112) thus automatically enabling/disabling the bank (108B) when that bit is written. For example, if bit (110) is set to one, writing to the bank (108B) is enabled; while if bit (110) is set to zero, writing to the bank (108B) is disabled.

In one embodiment, bank (108A) is written to during manufacturing of the PMIC (100). Thus, in one embodiment, a manufacturer may write a one or zero to bit (110) achieving the effect of providing or not providing, respectively, one-time programmable features to the PMIC (100).

PMIC (100) additionally includes access control logic (116) which controls access to banks (108A, 108B). In one embodiment, access control logic (116) may comprise a controllable switch or fuse that switches between banks (108A, 108B).

In an initial state, access control logic (116) is switched to provide access to the bank (108A) (e.g., to circuits 102-106). The access control logic (116) may later receive a write request from host application (120) via an interface (114). In one embodiment, the access control logic (116) includes a second switch driven by the write enable (112) that determines whether data in the write request may be written to the bank (108B). If the write enable (112) is enabled, access control logic (116) permits the writing to the bank (108B). After writing is complete, the access control logic (116) toggles the first switch such that future requests from circuits (102-106) are routed automatically to the second bank (108B).

Figure 2:
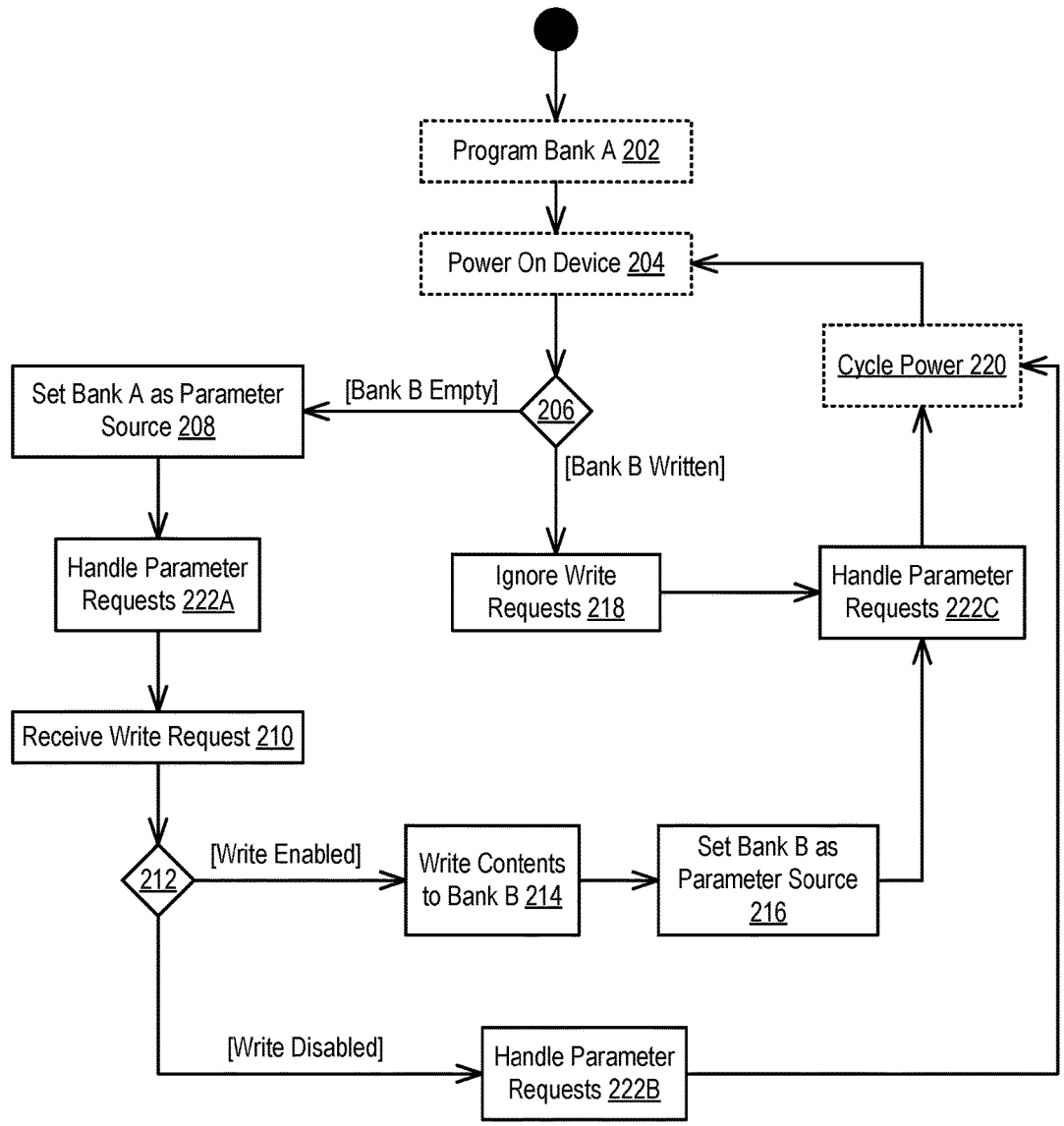
FIG. 2 is a flow diagram illustrating a method for toggling between OTP memory banks according to some embodiments of the disclosure.

FIG. 2 is a flow diagram illustrating a method for toggling between OTP memory banks according to some embodiments of the disclosure. In one embodiment, the method performed in FIG. 2 is performed by a PMIC. In one embodiment, operations at blocks 206-222C may be controlled by access control logic in the PMIC, while other steps may be performed by other components of the PMIC (or in response to external inputs).

At block 202, bank A is programmed. As described above, bank A comprises an OTP memory bank. In one embodiment, bank A is programmed by a manufacturer of the PMIC, although the specific programmer is not intended to be limited. As discussed above, bank A includes all non-volatile parameters needed to operate the PMIC.

At block 204, the method powers on the PMIC device. In one embodiment, powering on the PMIC device causes the circuits of the PMIC device to issue read requests to the PMICs memory to retrieve operational parameters.

At block 206, the method determines whether data has been written to bank B. As described above, bank B may also comprise an OTP memory bank that is uninitialized during manufacturing and, potentially, written to after manufacturing.

In one embodiment, the operation at block 206 is performed in response to a request for data from the circuitry of the PMIC. In one embodiment, step 206 may be performed by a CMOS or similar switch within the access control logic of the PMIC. In another embodiment, the operation at block 206 may be performed immediately upon powering the PMIC.

If bank B is empty (i.e., not written to), the method sets bank A as the parameter source at block 208. In one embodiment, between block 208 and 210, the method may receive one or more requests for data from the circuitry of the PMIC (Mock 222A). In response to these requests, the method responds to the requests with the data stored in bank A. These requests may continue until a write request is received and may continue during the actual write request.

At block 210, the method receives a write request. In one embodiment, the write request includes data to be written to bank B. In one embodiment, the write request is received from a host application over a bus and interface, as described previously.

At block 212, the method determines if writing is enabled for bank B. In one embodiment, the method makes this determination by detecting whether a write enable signal is enabled or disabled for bank B. In one embodiment, the operation at block 212 additionally includes determining whether data has already been written to bank B.

If the writing is not enabled, the method continues to handle parameter requests from circuitry using bank A (block 222B). This process continues until power to the PMIC is cycled (block 220).

Alternatively, if the method determines that writing is enabled at block 212, the method writes the contents of the write request to bank B at block 214. In some embodiments, the write request may include all data to be written to bank B. In other embodiments, the write request may comprise multiple sub-requests including data to be written, delimited by START and STOP commands.

At block 216, after writing to bank B is complete, the method sets bank B as the parameter source for future requests and handles parameter requests using bank B (block 222C) for future requests until power is cycled (block 220).

Returning to block 206, if the method determines that bank B has been written to in response to a power on or power cycle, the method ignores any future write requests (block 218). Since bank B has been written to, the method proceeds to handle all parameter requests from bank B (block 222C) until power cycling.

Figure 3:
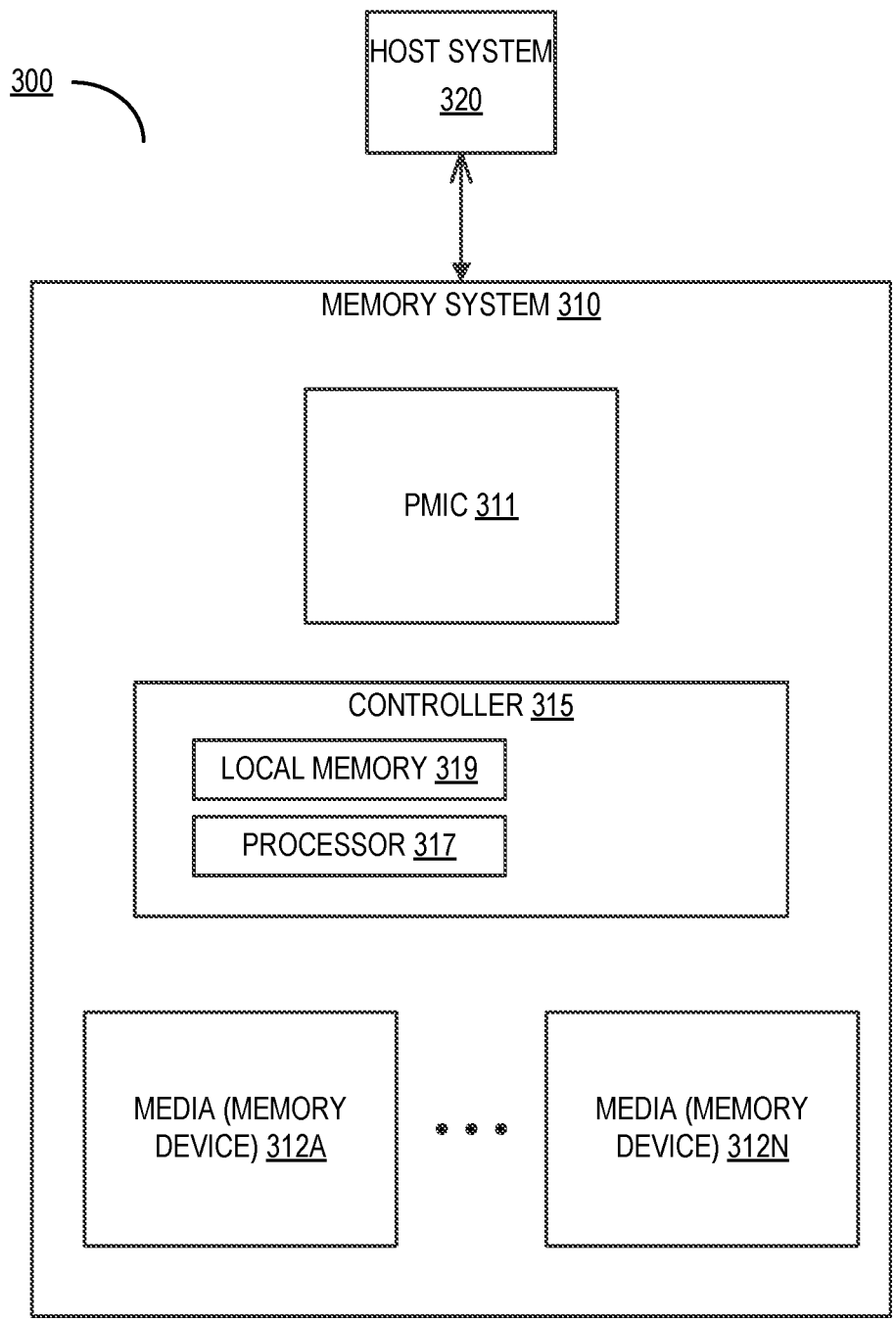
FIG. 3 illustrates an example computing environment that includes a memory system in accordance with some implementations of the present disclosure.

FIG. 3 illustrates an example computing environment 300 that includes a memory system 310 in accordance with some implementations of the present disclosure. The memory system 310 can include media, such as memory devices 312A to 312N. The memory devices 312A to 312N can be volatile memory devices, non-volatile memory devices, or a combination of such. In some embodiments, the memory system is a storage system. An example of a storage system is a SSD. In some embodiments, the memory system 310 is a hybrid memory/storage system. In general, the computing environment 300 can include a host system 320 that uses the memory system 310. In some implementations, the host system 320 can write data to the memory system 310 and read data from the memory system 310.

The host system 320 can be a computing device such as a desktop computer, laptop computer, network server, mobile device, or such computing device that includes a memory and a processing device. The host system 320 can include or be coupled to the memory system 310 so that the host system 320 can read data from or write data to the memory system 310. The host system 320 can be coupled to the memory system 310 via a physical host interface. As used herein, "coupled to" generally refers to a connection between components, which can be an indirect communicative connection or direct communicative connection (e.g., without intervening components), whether wired or wireless, including connections such as, electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 320 and the memory system 310. The host system 320 can further utilize an NVM Express (NVMe) interface to access the memory devices 312A to 312N when the memory system 310 is coupled with the host system 320 by the PCIe interface. The physical host interface can provide an interface for passing control, address, data, and other signals between the memory system 310 and the host system 320.

The memory devices 312A to 312N can include any combination of the different types of non-volatile memory devices and/or volatile memory devices. An example of non-volatile memory devices includes a negative- and (NAND) type flash memory. Each of the memory devices 312A to 312N can include one or more arrays of memory cells such as single level cells (SLCs) or multi-level cells (MLCs) (e.g., triple level cells (TLCs) or quad-level cells (QLCs)). In some implementations, a particular memory device can include both an SLC portion and a MLC portion of memory cells. Each of the memory cells can store bits of data (e.g., data blocks) used by the host system 320. Although non-volatile memory devices such as NAND type flash memory are described, the memory devices 312A to 312N can be based on any other type of memory such as a volatile memory. In some implementations, the memory devices 312A to 312N can be, but are not limited to, random access memory (RAM), read-only memory (ROM), dynamic random access memory (DRAM), synchronous dynamic random access memory (SDRAM), phase change memory (PCM), magneto random access memory (MRAM), negative- or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many Flash-based memory, cross point non-volatile memory can perform a write in-place operation, where a non-volatile memory cell can be programmed without the non-volatile memory cell being previously erased. Furthermore, the memory cells of the memory devices 312A to 312N can be grouped as memory pages or data blocks that can refer to a unit of the memory device used to store data.

The controller 315 can communicate with the memory devices 312A to 312N to perform operations such as reading data, writing data, or erasing data at the memory devices 312A to 312N and other such operations. The controller 315 can include hardware such as one or more integrated circuits and/or discrete components, a buffer memory, or a combination thereof. The controller 315 can be a microcontroller, special purpose logic circuitry (e.g., a field programmable gate array (FPGA), an application specific integrated circuit (ASIC), etc.), or other suitable processor. The controller 315 can include a processor (processing device) 317 configured to execute instructions stored in local memory 319. In the illustrated example, the local memory 319 of the controller 315 includes an embedded memory configured to store instructions for performing various processes, operations, logic flows, and routines that control operation of the memory system 310, including handling communications between the memory system 310 and the host system 320. In some embodiments, the local memory 319 can include memory registers storing, e.g., memory pointers, fetched data, etc. The local memory 319 can also include read-only memory (ROM) for storing micro-code. While the example memory system 310 in FIG. 3 has been illustrated as including the controller 315, in another embodiment of the present disclosure, a memory system 310 may not include a controller 315, and may instead rely upon external control (e.g., provided by an external host, or by a processor or controller separate from the memory system).

In general, the controller 315 can receive commands or operations from the host system 320 and can convert the commands or operations into instructions or appropriate commands to achieve the desired access to the memory devices 312A to 312N. The controller 315 can be responsible for other operations such as wear leveling operations, garbage collection operations, error detection and error-correcting code (ECC) operations, encryption operations, caching operations, and address translations between a logical block address and a physical block address that are associated with the memory devices 312A to 312N. The controller 315 can further include host interface circuitry to communicate with the host system 320 via the physical host interface. The host interface circuitry can convert the commands received from the host system into command instructions to access the memory devices 312A to 312N as well as convert responses associated with the memory devices 312A to 312N into information for the host system 320.

The memory system 310 can also include additional circuitry or components that are not illustrated. In some implementations, the memory system 310 can include a cache or buffer (e.g., DRAM) and address circuitry (e.g., a row decoder and a column decoder) that can receive an address from the controller 315 and decode the address to access the memory devices 312A to 312N.

The memory system 310 can include PMIC 311 (e.g., PMIC 100 in FIG. 1). The memory system 310 can include additional circuitry, such as illustrated in FIG. 1.

In this description, various functions and operations may be described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

While some embodiments can be implemented in fully functioning computers and computer systems, various embodiments are capable of being distributed as a computing product in a variety of forms and are capable of being applied regardless of the particular type of machine or computer-readable media used to actually effect the distribution.

At least some aspects disclosed can be embodied, at least in part, in software. That is, the techniques may be carried out in a computer system or other data processing system in response to its processor, such as a microprocessor or microcontroller, executing sequences of instructions contained in a memory, such as ROM, volatile RAM, non-volatile memory, cache or a remote storage device.

Routines executed to implement the embodiments may be implemented as part of an operating system or a specific application, component, program, object, module or sequence of instructions referred to as "computer programs." The computer programs typically comprise one or more instructions set at various times in various memory and storage devices in a computer, and that, when read and executed by one or more processors in a computer, cause the computer to perform operations necessary to execute elements involving the various aspects.

A tangible, non-transitory computer storage medium can be used to store software and data which, when executed by a data processing system, causes the system to perform various methods. The executable software and data may be stored in various places including for example ROM, volatile RAM, non-volatile memory and/or cache. Portions of this software and/or data may be stored in any one of these storage devices. Further, the data and instructions can be obtained from centralized servers or peer-to-peer networks. Different portions of the data and instructions can be obtained from different centralized servers and/or peer-to-peer networks at different times and in different communication sessions or in a same communication session. The data and instructions can be obtained in their entirety prior to the execution of the applications. Alternatively, portions of the data and instructions can be obtained dynamically, just in time, when needed for execution. Thus, it is not required that the data and instructions be on a machine-readable medium in their entirety at a particular instance of time.

Examples of computer-readable storage media include, but are not limited to, recordable and non-recordable type media such as volatile and non-volatile memory devices, read only memory (ROM), random access memory (RAM), flash memory devices, floppy and other removable disks, magnetic disk storage media, and optical storage media (e.g., Compact Disk Read-Only Memory (CD ROM), Digital Versatile Disks (DVDs), etc.), among others. The instructions may be embodied in a transitory medium, such as electrical, optical, acoustical or other forms of propagated signals, such as carrier waves, infrared signals, digital signals, etc. A transitory medium is typically used to transmit instructions, but not viewed as capable of storing the instructions.

In various embodiments, hardwired circuitry may be used in combination with software instructions to implement the techniques. Thus, the techniques are neither limited to any specific combination of hardware circuitry and software, nor to any particular source for the instructions executed by the data processing system.

Although some of the drawings illustrate a number of operations in a particular order, operations that are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

The above description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A power management integrated circuit (PMIC) comprising:
    a first one-time programmable (OTP) memory bank;
    a second OTP memory bank, wherein the first OTP memory bank
    comprises a first bit, the first bit controlling write access to the second OTP memory bank, the first bit being hardwired to a write enable of the second OTP memory bank; and
    access control logic, communicatively coupled to the first OTP memory bank and the second OTP memory bank, the access control logic configured to:
        utilize the first OTP memory bank for operation of the PMIC upon detecting that the second OTP memory bank is empty,
        write data to the second OTP memory bank in response to a write request from a host application if the second OTP memory bank is not empty, and
        utilize the second OTP memory bank for operation of the PMIC upon detecting that the second OTP memory bank is not empty.

2. The PMIC of claim 1, wherein the first OTP memory bank is pre-programmed prior to use and the second OTP memory bank is empty prior to use.

3. The PMIC of claim 1, the access control logic further configured to select between the first OTP memory bank and the second OTP memory bank after a power cycle.

4. The PMIC of claim 1, the access control logic further configured to ignore the write request if the second OTP memory bank is not empty.

5. The PMIC of claim 1, further comprising an interface configured to receive the write request over a bus.

6. The PMIC of claim 5, the write request conforming to an I2C protocol message.

7. The PMIC of claim 1, further comprising at least one of switch driver, a voltage regulator, or a sequencer.

8. The PMIC of claim 1, further comprising a switch driver, the switch driver configured to drive a solid-state storage device.

9. A method comprising:
   determining, by a power management integrated circuit (PMIC), whether a second one-time programmable (OTP) memory bank contains data;
   utilizing, by the PMIC, a first OTP memory bank as a parameter source if the second OTP memory bank does not contain data;
   enabling, by the PMIC, write access to the second OTP memory bank by writing to a first bit in the first OTP memory bank, the first bit being hardwired to a write enable of the second OTP memory bank;
   writing, by the PMIC, data to the second OTP memory bank in response to a write request from a host application if the second OTP memory bank is not empty; and
   utilizing, by the PMIC, the second OTP memory bank as a parameter source if the second OTP memory bank does contain data.

10. The method of claim 9, the determining whether the second OTP memory bank contains data performed in response to powering on the PMIC.

11. The method of claim 10, the powering on the PMIC resulting from a power cycle.

12. The method of claim 9, the writing data to the second OTP memory bank performed upon determining that writing is enabled for the second OTP memory bank.

13. The method of claim 12, the determining that writing is enabled for the second OTP memory bank comprising analyzing the write enable of the second OTP memory bank.

14. The method of claim 9, the utilizing the first OTP memory bank as a parameter source and utilizing the second OTP memory bank as a parameter source both comprising supply parameters from a respective memory bank to circuitry of the PMIC.

15. The method of claim 9, further comprising pre-programming the first OTP memory bank prior to use.

16. The method of claim 15, the second OTP memory bank being uninitialized prior to use.

17. The method of claim 9, further comprising ignoring the write request if data is stored in the second OTP memory bank.

18. The method of claim 9, further comprising receiving the write request from the host application over a bus.

\* \* \* \* \*